United States Patent
Dai

(10) Patent No.: US 9,319,613 B2
(45) Date of Patent: Apr. 19, 2016

(54) IMAGE SENSOR HAVING NMOS SOURCE FOLLOWER WITH P-TYPE DOPING IN POLYSILICON GATE

(71) Applicant: OmniVision Technologies, Inc., Santa Clara, CA (US)

(72) Inventor: Tiejun Dai, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 83 days.

(21) Appl. No.: 14/097,779

(22) Filed: Dec. 5, 2013

(65) Prior Publication Data

US 2015/0163428 A1 Jun. 11, 2015

(51) Int. Cl.
*H04N 5/378* (2011.01)
*H01L 27/146* (2006.01)

(52) U.S. Cl.
CPC .......... *H04N 5/378* (2013.01); *H01L 27/14612* (2013.01); *H01L 27/14641* (2013.01); *H01L 27/14643* (2013.01)

(58) Field of Classification Search
CPC ..... H04N 5/378; H04N 5/374; H04N 5/3745; H04N 5/37457; H01L 27/146; H01L 27/14643; H01L 27/14612; H01L 27/14614; H01L 27/14616; H01L 27/14641
See application file for complete search history.

(56) References Cited

U.S. PATENT DOCUMENTS

| | | | |
|---|---|---|---|
| 4,546,366 A * | 10/1985 | Buchanan | 257/49 |
| 6,245,607 B1 * | 6/2001 | Tang et al. | 438/217 |
| 6,621,125 B1 * | 9/2003 | Wang | 257/355 |
| 6,630,701 B1 * | 10/2003 | Rhodes | 257/292 |
| 6,768,174 B2 | 7/2004 | Hasegawa et al. | |
| 7,265,397 B1 * | 9/2007 | Tower et al. | 257/223 |
| 2004/0150052 A1 * | 8/2004 | Riccardi et al. | 257/369 |
| 2004/0262651 A1 | 12/2004 | Mouli | |
| 2005/0104108 A1 * | 5/2005 | Hong | 257/298 |
| 2006/0060753 A1 * | 3/2006 | Rhodes | 250/208.1 |
| 2006/0108618 A1 * | 5/2006 | Ahn et al. | 257/292 |
| 2006/0119720 A1 * | 6/2006 | Hong | 348/308 |
| 2007/0069258 A1 * | 3/2007 | Ahn | 257/290 |
| 2007/0267666 A1 * | 11/2007 | Park et al. | 257/292 |
| 2009/0078973 A1 * | 3/2009 | Hsu et al. | 257/292 |
| 2009/0298272 A1 * | 12/2009 | Rhodes | 438/587 |
| 2010/0079645 A1 * | 4/2010 | Rhodes | 348/302 |
| 2010/0201860 A1 * | 8/2010 | Rhodes | 348/308 |
| 2011/0095188 A1 * | 4/2011 | Qian et al. | 250/338.4 |
| 2011/0096215 A1 * | 4/2011 | Choi et al. | 348/294 |
| 2011/0122307 A1 * | 5/2011 | Parks | 348/308 |

(Continued)

OTHER PUBLICATIONS

Chen, Yue et al. Characterization of In-Pixel Buried-Channel Source Follower with Optimized Row Selector in CMOS Image Sensors [online]. No date; [retrieved on Dec. 4, 2015]. Retrieved from the internet: <URL:http://www.harvestimaging.com/pubdocs/131_2009_IISW_buriedchannel.pdf>.*

(Continued)

*Primary Examiner* — John Lee
(74) *Attorney, Agent, or Firm* — Lathrop & Gage LLP

(57) ABSTRACT

An image sensor array has a tiling unit comprising a source follower stage coupled to buffer signals from a photodiode when the unit is read onto a sense line, the source follower stage differs from conventional sensor arrays because it uses an N-channel transistor having a P-doped polysilicon gate. In embodiments, other transistors of the array have conventional N-channel transistors with N-doped polysilicon gates.

10 Claims, 2 Drawing Sheets

(56) References Cited

U.S. PATENT DOCUMENTS

| | | | |
|---|---|---|---|
| 2012/0001056 A1 | 1/2012 | Fife et al. | |
| 2013/0082312 A1* | 4/2013 | Hung et al. | 257/292 |
| 2013/0221418 A1* | 8/2013 | Mitchell et al. | 257/296 |
| 2013/0270663 A1* | 10/2013 | Lin et al. | 257/432 |
| 2013/0320407 A1* | 12/2013 | Ahn | 257/239 |
| 2013/0334399 A1* | 12/2013 | Dupont | 250/208.1 |
| 2014/0048853 A1* | 2/2014 | Choi et al. | 257/231 |
| 2014/0264503 A1* | 9/2014 | Sze | 257/292 |
| 2014/0284664 A1* | 9/2014 | Shin | 257/225 |
| 2015/0048427 A1* | 2/2015 | Hu et al. | 257/239 |

OTHER PUBLICATIONS

Steyaert, et al. "Power Supply Rejection Ratio in Operational Transonductance Amplifiers," IEEE Transactions on Circuits and Systems, vol. 37, No. 9, Sep. 1990, pp. 1077-1084.

Komaragiri, R. et al., "Depletion-Free Poly Gate Electrode Architecture for Sub 100 Nanometer CMOS Devices with High-K Gate Dielectrics", IEEEIEDM Tech Dig., San Francisco CA, 833-836, Dec. 13-15, 2004.

Taiwanese Patent Application 103141514 Office Action dated Nov. 17, 2015 and received Nov. 30, 2015, 9 pages.

\* cited by examiner

IMAGE SENSOR HAVING NMOS SOURCE FOLLOWER WITH P-TYPE DOPING IN POLYSILICON GATE

FIELD

The present document relates to the field of CMOS image sensors.

BACKGROUND

CMOS image sensor array integrated circuits typically have at least two basic types of transistors, a P-type transistor having a P-doped poliysilicon gate, and an N-type transistor having an N-doped polysilicon gate. It is known that thresholds of N and P devices may be adjusted using an ion implant. CMOS image sensor array integrated circuits may have N and P type transistors with two or more threshold voltages determined by appropriately masked implants.

A common architecture for CMOS image sensor arrays uses a tiling unit within the sensor array. This tiling unit has at least one photodiode coupled to one or more transistors arranged to charge, or reset, an electrode of the photodiode to reverse-bias the photodiode to a known "reset" charge level. The photodiode is then exposed to a portion of a lit image, which may discharge some of the charge on the photodiode. The tiling unit also has a source follower coupled or coupleable to the photodiode and to a column sense line; the source follower serves as a buffer that allows reading of remaining charge on the photodiode.

In order to get good photodiode sensitivity, it is desirable to bias the photodiode to a high "reset" level. Black pixels, however, return nearly as high a voltage when read to the source follower as when charged. Should the reset charge level be near the power voltage to the source follower, and with a low threshold in the source-follower, this can give a low drop in the source-follower stage. With typical N-channel thresholds on the source follower, the follower has a low power-supply rejection ratio, potentially causing noise in pictures.

SUMMARY

An image sensor array has a tiling unit comprising a source follower stage coupled to buffer signals from a photodiode when the unit is read onto a sense line. The source follower stage differs from conventional sensor arrays because it uses an N-channel transistor having a P-doped polysilicon gate. In embodiments, other transistors of the array have conventional N-channel transistors with N-doped polysilicon gates.

DETAILED DESCRIPTION OF THE EMBODIMENTS

Figure 1:
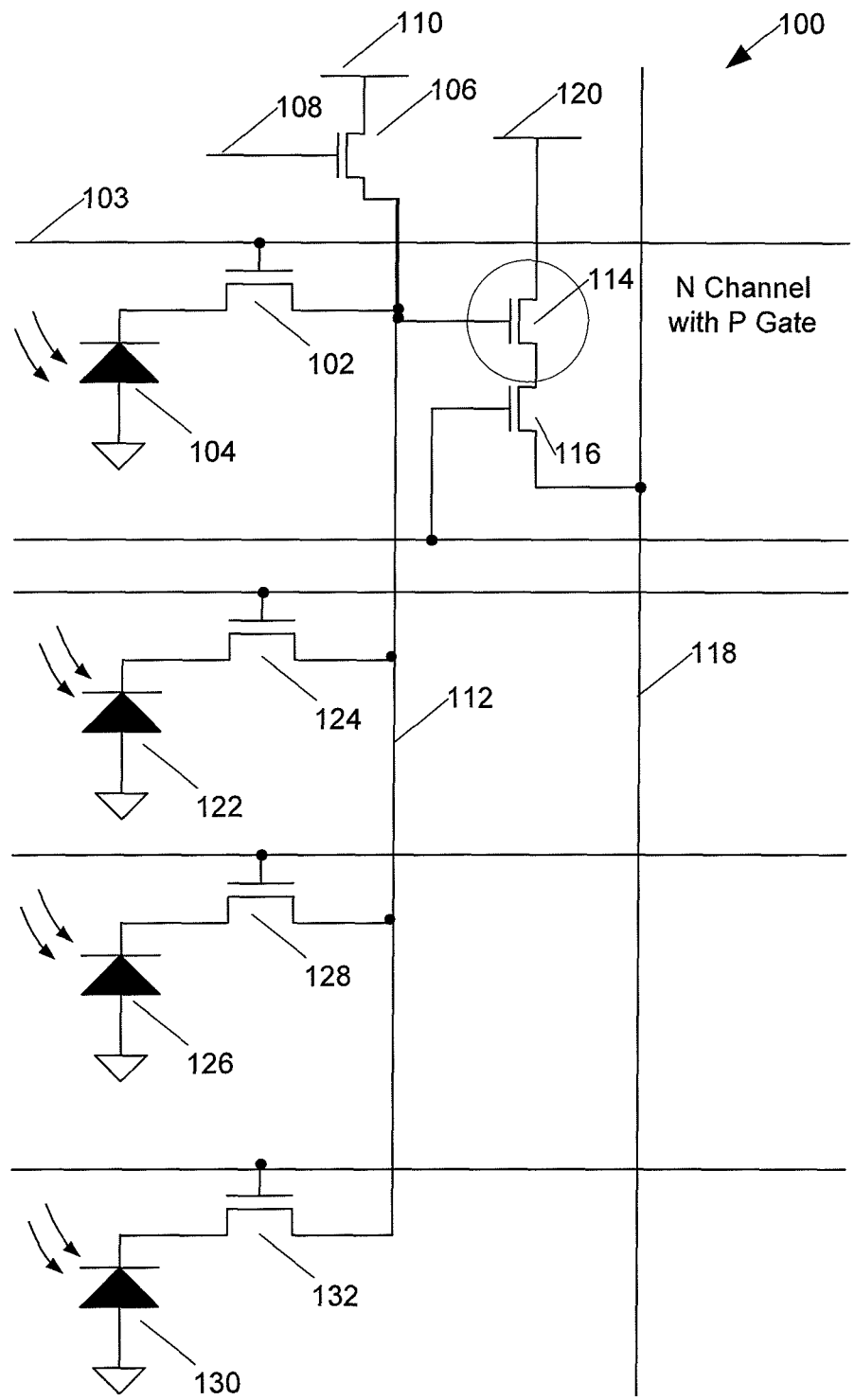
FIG. 1 is a schematic diagram of a tiling unit for a CMOS image sensor array.

An embodiment of a tiling unit 100 for a CMOS image sensor array has a schematic diagram illustrated in FIG. 1. This tiling unit has at least one pair of row-selection transistor 102, and photodiode 104. The row-selection transistor is enabled by a row-select line 103. A precharge or reset 106 transistor, enabled by a reset signal 108, is provided to couple a reset power supply 110 through a floating node 112 and row-selection transistor 102 to precharge or reset the photodiode 104. Once the photodiode 104 is exposed to light, it is coupled through row selection transistor 102 and floating node 112 onto a gate of a source-follower transistor 114, and read through a readout row selection transistor 116 onto a column data line 118. The source follower 114 is powered by a power supply 120. The floating node 112 of the tiling unit may, in some embodiments, also operate with one or a few additional pairs of photodiode and row selection transistor, such as second photodiode 122, second row selection transistor 124, third photodiode 126, third row selection transistor 128, fourth photodiode 130, and fourth row selection transistor 132. The circuitry of FIG. 1 is called a tiling unit because an image sensor array often has many similar units laid out in the array in a manner resembling tiles on a floor, although these units may be found upright as well as in orientations mirrored about one or more axes. Such an array is typically surrounded by row and column decoders, sense amplifiers, and other circuitry for controlling the array and for scanning captured images out of the array.

Figure 2:
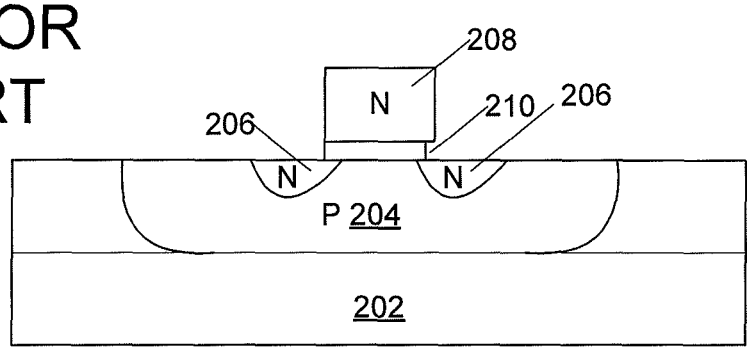
FIG. 2 is an exemplary cross-section of a PRIOR ART conventional N-channel transistor with N-channel polysilicongate.
Figure 3:
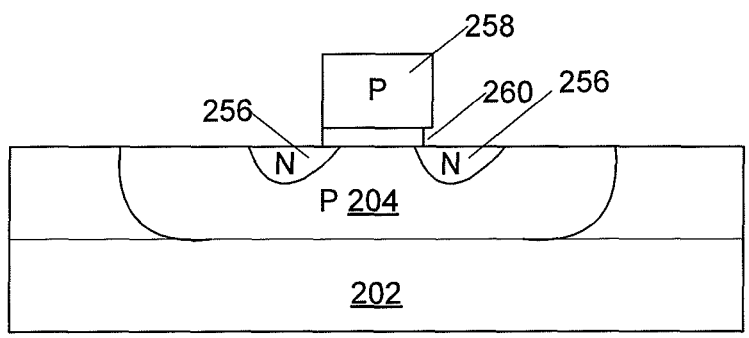
FIG. 3 is an exemplary cross-section of a modified N-channel transistor with P-channel polysilicon gate.

In an embodiment, most N-channel transistors, including row selection transistors 102, 124, 128, 132, reset transistor 106, and readout row selection transistor 116, are N-channel transistors as known in the prior art having low threshold voltages, and some of these are fabricated with N-doped polysilicon gate structures 208, over thin gate oxide 210, and N-doped source and drain 206, located in a lightly-doped P-type well 204, on substrate 202, as shown in FIG. 2.

The tiling unit 100 of FIG. 1, however, uses a modified N-channel transistor for source-follower transistor 114 only. The modified N-channel transistor has a higher threshold voltage, and is fabricated with P-doped polysilicon gate structures 258, over thin gate oxide 260, an N-doped source and drain 256, located in a lightly-doped P-type well 204, on substrate 202, as shown in FIG. 2. While P-poly N-channel transistors are known, they have not previously been combined with conventional N-poly N-channel transistors in a tiling unit of a photosensor array integrated circuit.

It has been found that the higher threshold of the modified N-channel source-follower transistor lowers the output voltage of source-follower 114, thereby increasing the source-to-drain voltage of source-follower 114. In turn, this improves power supply rejection ratio of the source follower, and reduces noise at the column sense line 118 over a similar tiling unit having a conventional source-follower stage.

In operation, each photodiode in the tiling unit of the photodiode array image sensor is read by passing charge remaining after exposure to light from the photodiode, such as photodiode 104, through a pass device, such as pass device 102, to the source follower device 114 of the tiling unit, and as heretofore described the pass device is a silicon device having a same polarity channel as dopant in a gate of the pass device; in most cases both source and gate will have a primary dopant of arsenic for N-channel devices, although in alternative processes the primary dopant for a gate of an N-channel device is phosphorous while the source and drain are doped with arsenic. Signal as passed by the pass device is then buffered in the source-follower device 114, the source follower device having an opposite polarity channel as dopant in a gate of the source follower; in most cases the source and drain of the source-follower have a primary dopant of arsenic, while the gate has a primary dopant of boron.

While the device as described has N-channel devices with conventional N-doped, and unconventional P-doped gates, the device can be built in complementary form. In complementary form, devices described above as N-channel with N-doped gates are replaced with P-channel devices with P-doped gates, and those that are described as N-channel with P-doped gates replaced with P-channel devices with N-doped gates; the P-channel devices in most instances will be doped with Boron.

While the invention has been particularly shown and described with reference to specific embodiments thereof, it will be understood by those skilled in the art that various other changes in the form and details may be made without departing from the spirit and scope of the invention. It is to be understood that various changes may be made in adapting the invention to different embodiments without departing from the broader inventive concepts disclosed herein and comprehended by the claims that follow.

What is claimed is:

1. An image sensor array comprising
a tiling unit comprising a source-follower stage coupled to buffer a signal from a photodiode when read onto a sense line, wherein the source-follower stage comprises a source-follower transistor having source and drain doped as opposite doping type from a polysilicon gate of the same transistor, while at least a second transistor of the tiling unit has a transistor with source, drain, and polysilicon gate all doped with the same doping type; the source-follower transistor having greater threshold voltage than the second transistor.

2. An image sensor array comprising
a tiling unit comprising a source-follower stage coupled to buffer a signal from a photodiode when read onto a sense line, wherein the source-follower stage comprises an N-channel source-follower transistor having an N-type source, an N-type drain, and a P-doped polysilicon gate;
a first selection transistor coupled to pass a signal from the photodiode to the source-follower stage, the first selection transistor being an N-channel transistor having an N-doped polysilicon gate;
wherein the source-follower transistor has greater threshold voltage than the selection transistor.

3. The image sensor array of claim 2 wherein the tiling unit further comprises a second photodiode and a second selection transistor, the second row selection transistor being coupled to the source-follower stage, the first and second selection transistors are coupled to a source of a reset transistor, and a drain of the reset transistor is coupled to a reset power supply.

4. The image sensor array of claim 3 wherein the source-follower stage is coupled to the sense line through a readout selection transistor.

5. A method of sensing a photodiode in a photodiode array image sensor comprising:
passing charge from the photodiode through a pass device to a source-follower device, the pass device having a same type drain dopant type as a primary dopant type in a gate of the pass device;
buffering signal from the pass device in the source-follower device, the source-follower device having an opposite polarity drain dopant type as a primary dopant type in a gate of the source-follower; the source-follower device having a higher threshold than the pass device.

6. The method of claim 5 wherein the dopant in the gate of the pass device is selected from the group consisting of phosphorous and arsenic, and the primary dopant in the gate of the source-follower is boron.

7. The method of claim 5 wherein the dopant in the gate of the source-follower device is selected from the group consisting of phosphorous and arsenic, and the primary dopant in the gate of the pass device is boron.

8. The image sensor array of claim 1 wherein the second transistor is a selection transistor of the tiling unit and is coupled to pass a signal from the photodiode to the source.

9. The image sensor array of claim 8 wherein the tiling unit further comprises a second photodiode and a second selection transistor, the second selection transistor being coupled to the source-follower stage, the first and second selection transistors are coupled to a source of a reset transistor, and a drain of the reset transistor is coupled to a reset power source.

10. The image sensor array of claim 9 wherein the source-follower stage is coupled to the sense line through a readout selection transistor.

* * * * *